(12) United States Patent
Cross et al.

(10) Patent No.: US 12,235,224 B2
(45) Date of Patent: Feb. 25, 2025

(54) PROCESS WINDOW QUALIFICATION MODULATION LAYOUTS

(71) Applicant: KLA CORPORATION, Milpitas, CA (US)

(72) Inventors: Andrew Cross, Hale (GB); Kaushik Sah, Holsbeek (BE); Martin Plihal, San Francisco, CA (US)

(73) Assignee: KLA CORPORATION, Milpitas, CA (US)

( * ) Notice: Subject to any disclaimer, the term of this patent is extended or adjusted under 35 U.S.C. 154(b) by 100 days.

(21) Appl. No.: 17/730,116

(22) Filed: Apr. 26, 2022

(65) Prior Publication Data

US 2023/0175983 A1    Jun. 8, 2023

Related U.S. Application Data

(60) Provisional application No. 63/287,097, filed on Dec. 8, 2021.

(51) Int. Cl.
  *G03F 7/00*     (2006.01)
  *G01N 21/956*   (2006.01)

(52) U.S. Cl.
  CPC ....... G01N 21/956 (2013.01); *G03F 7/70558* (2013.01); *G03F 7/70641* (2013.01);
  (Continued)

(58) Field of Classification Search
  CPC ...... G03F 7/70641; G03F 7/7065; G03F 7/70; G03F 7/70283; G03F 7/7055; G03F 7/70591; G03F 7/70608–70683; G03F 7/70483–70541; G03F 7/70425; G03F 7/70433; G03F 1/68; G03F 1/82; G03F 1/84; G03F 7/705; G03F 7/70605–706851; G01N 21/9505; G01N 21/956; G01N 2021/95676; G01N 2021/061; G06T 7/0006; G06T 2207/30148
  (Continued)

(56) References Cited

U.S. PATENT DOCUMENTS 6,902,855 B2    6/2005    Peterson et al.
7,418,124 B2    8/2008    Peterson et al.
(Continued)

FOREIGN PATENT DOCUMENTS

KR    20130005241 A    1/2013
KR    20210027533 A    3/2021

OTHER PUBLICATIONS

WIPO, International Search Report for International Application No. PCT/US2022/049336, Mar. 21, 2023.
(Continued)

*Primary Examiner* — Christina A Riddle
(74) *Attorney, Agent, or Firm* — Hodgson Russ LLP

(57) ABSTRACT

Process window qualification (PWQ) layouts can be used to determine a presence of a pattern anomaly associated with the pattern, patterning process, or patterning apparatus. For example, a modulated die or field can be compared to a slightly lower offset modulated die or field. In another example, the high to low corners for a particular condition or combination of conditions are compared. In yet another example, process modulation parameters can be used to estimate criticality of particular weak points of interest.

4 Claims, 7 Drawing Sheets

(52) U.S. Cl.
CPC ...... *G03F 7/7065* (2013.01); *G03F 7/706837* (2023.05); *G01N 2021/95676* (2013.01)

(58) Field of Classification Search
USPC ...... 355/18, 30, 52–55, 67–77; 430/5, 8, 22, 430/30
See application file for complete search history.

(56) References Cited

U.S. PATENT DOCUMENTS

| | | | |
|---|---|---|---|
| 7,729,529 B2 | 6/2010 | Wu et al. | |
| 7,769,225 B2 | 8/2010 | Kekare et al. | |
| 8,213,704 B2 | 7/2012 | Peterson et al. | |
| 10,503,078 B2 | 12/2019 | Saraswatula et al. | |
| 2004/0009416 A1* | 1/2004 | Peterson | G03F 7/70641 430/311 |
| 2006/0291714 A1* | 12/2006 | Wu | G03F 7/7065 382/149 |
| 2007/0031745 A1* | 2/2007 | Ye | G03F 7/705 430/30 |
| 2009/0231424 A1* | 9/2009 | Honda | H01L 22/12 348/87 |
| 2011/0276935 A1* | 11/2011 | Fouquet | G06F 30/398 716/112 |
| 2015/0199803 A1* | 7/2015 | Park | G06T 7/001 382/149 |
| 2016/0150191 A1* | 5/2016 | Karsenti | H04L 67/306 382/149 |
| 2016/0313647 A1* | 10/2016 | Halder | G03F 7/7065 |
| 2017/0153554 A1 | 6/2017 | Hinnen et al. | |
| 2017/0160648 A1* | 6/2017 | Tel | G03F 7/70516 |
| 2018/0174797 A1 | 6/2018 | Cross et al. | |
| 2021/0042908 A1 | 2/2021 | Liang et al. | |

OTHER PUBLICATIONS

WIPO, Written Opinion of the International Searching Authority for International Application No. PCT/US2022/049336, Mar. 21, 2023.

* cited by examiner

PROCESS WINDOW QUALIFICATION MODULATION LAYOUTS

FIELD OF THE DISCLOSURE

This disclosure relates to semiconductor inspection.

BACKGROUND OF THE DISCLOSURE

The need for improved semiconductor inspection and review tools continues to grow. For example, there is a need for improved quantification of defects detected by optical and scanning electron microscope (SEM) based inspection methods. Due to semiconductor device design rules and the complexity associated with multi-patterning, the ability to distinguish a defect from potential noise is challenging. Distinguishing a defect from noise is even more challenging in the case of systematic defects that may be related to subtle variations of critical patterns. Currently, optical and SEM inspection methods, such as process window discovery, are used to identify such systematic defects and sample these "hot spots" for review. This approach relies on the use of modulated fields within a wafer to cause the weakest structures to fail in order to enhance detection, allowing for the identification of the edge of the process window.

One aspect of semiconductor manufacturing is to identify all pattern defects on both the mask or reticle and the wafer to ensure adequate yield of advanced devices. Focus-exposure matrices (FEM) and process window qualification (PWQ) have been processes used to identify defects on the wafer after print down, with the potential to identify design-related defects, reticle defects, or process-induced defects. The defects identified were typically limited to systematic pattern defects. Systematic pattern defects generally occur at a given location, and historically have been due to a weakness of the designed pattern or due to the quality of optical proximity correction (OPC) or sub-resolution assist feature (SRAF) implementations. The above-mentioned processes worked reasonably well to identify pattern defects, until extreme ultraviolet lithography (EUV) was introduced.

PWQ is a type of inspection performed on a specimen fabricated in a particular way that can check if a specific chip design can be manufactured (e.g., be free of critical hot spots) and to decide about the optimal parameters for a lithography process. For example, PWQ can be used to determine where features print on a wafer and if those features were expected. Usually, a focus-exposure modulated specimen is printed to simulate different process window conditions based on an estimated central condition, typically based on CD-SEM characterization of a focus exposure matrix (FEM) layout. The PWQ specimen is then inspected using a relatively sensitive optical inspection tool. The detected defects are divided into bins by a design-based algorithm that classifies the defects by type of printing error (a unique design structure is associated with each bin). To determine how a printing error is affecting the chip yield at different process modulations, a defect sampling strategy followed by SEM review is performed. For example, a few representative defects from each bin can be visited at different die modulations. This time-consuming procedure checks how a structure responds to changes in lithography parameters (focus/exposure) and is how the process window limits are determined. To increase sensitivity, a second iteration is sometimes performed. In that case, the previously identified printing errors can be used as micro care areas in the wafer inspection. The complete procedure may then be repeated, for example, initially on a short loop sample and further investigation can be made on a full stack.

The nature of PWQ is to induce pattern anomalies, such as transient repeating defects, by varying a process parameter or operating variable, such as focus, exposure, overlay, partial coherence of illumination, mode of illumination, or numerical aperture. Transient or "weak" repeating defects are defects that print under only specific conditions, such as, for example, defocus level, exposure dose, and photoresist uniformity conditions. The term "weak defects" also refers to defects that may not print or repeat at every location or field within a wafer, unlike "hard repeaters," where the defective pattern is permanently cast in the reticle. The narrowing process window is used to intentionally amplify any unexpected patterning behavior. The method increases the capture rate of pattern anomalies that sometimes depend on coincidental confluence of exposure, focus, illumination, and resolution at the wafer plane. There may be other process interactions, such as across wafer etch uniformity or even variations related to the wafer itself, such as flatness or bow.

The resulting information may include, for example, critical defects determined by PWQ, locations of defects of interest (DOI) based on hot spots (e.g., determined from inspection), hot spot information determined from logical bitmaps, a kill probability (KP) value determined from test results for a defect detected at a hot spot, any other process or yield information, or some combination thereof. A "hot spot" may be generally defined as a location in the design printed on the wafer at which a killer defect may be present. Data for the one or more attributes of the die image may define geometrical areas in the die image that have different values of one or more attributes. For example, this may include type(s) of features within the areas such as contact areas or dummy fill areas, "where to inspect" information or "care areas," "critical" areas in which a process failure is possible, or some combination thereof. The data may be acquired from a variety of sources including simulation, modeling, and/or analysis software products, other software such as design rule checking (DRC) or mask rule checking software, or some combination thereof.

PWQ sampling has been based on the qualitative assessment of an expert, such as an applications engineer, who would set up PWQ inspection recipe and would use a host of sampling mechanisms. These mechanisms include design based grouping (DBG) based sampling and process condition based sampling. With process condition based sampling for PWQ, the wafer map is laid out in a way that each die is uniquely modulated by focus or exposure. From each die, a number of defects are sampled based on design and defect attributes generated by a broad band plasma (BBP) inspection tool. The design-based attributes of process condition based sampling and diversity sampling do not consider design attributes. A high signal is detected from regions where there are no patterns in the immediate vicinity or are non-critical from process window (PW) perspective. Often these defects are referred to as SEM non-visuals (SNV). The signal could be coming from a layer below or from a non-critical pattern variation (e.g., a CD variation) and may have no relevance to the layer being inspected. Thus, the SEM review may not find anything at that location.

An exemplary PWQ layout is shown in FIG. 1 with columns of modulated and unmodulated die. The PWQ procedure can implement die-to-die inspection of a plurality of dies or other repetitive patterns on a semiconductor wafer or other substrate on which design patterns are printed by photoresist patterning performed in accordance with a lithographic process using either a single die reticle or a multi-die reticle. The procedure entails selecting an illumination operating variable to modulate. A layer of pattern recording material such as a photoresist covering a test wafer substrate is exposed in the form of a grid of regions arranged in rows and columns. The columns are arranged in a pattern of columns representing regions exposed to different values of a predetermined operating variable and columns representing regions exposed to a common reference value of the predetermined operating variable. Conventional inspection techniques identifying differences in the regions eliminate hard repetitive anomalies. Comparing differences between region values for a given column relative to a reference value identifies transient repetitive anomalies. Each repetitive anomaly identified is evaluated for critical status. The procedure of comparing images formed by different values of a lithographic operating variable enables qualifying single die reticles and detecting design pattern defects. If the anomaly identified is of a design pattern type, critical status would depend on the number of occurrences and location of the anomaly on the design pattern. In FIG. 1, at least two columns on the wafer are present, in its simplest form, on both sides of the modulated column. This enables die-die comparison of the modulated die or field to an unmodulated baseline die or field. Optical and/or SEM inspection can then be used to identify differences causing weak points in the field. This methodology can be performed on either short loop or full process wafers and typically the inspection evaluation is performed after etch, though ADS and after metallization also are possible.

Though the current PWQ layout has been used in semiconductor manufacturing, the number of nuisance defects seen with the layout can be problematic. This is especially true at higher modulations. Effort is needed to review a large number of defects to identify true weak points and patterns of interest. These nuisance defects are typically caused by variations between the modulated and unmodulated die that are not a concern, such as critical dimension (CD) variation, where due to the different exposure conditions in a modulated die/field the structures printing characteristics change leading to a CD change in the structure or subtle changes in shape. These changes are flagged by the optical or SEM inspector as differences and reported as defects. Classification is needed to understand if a detected defect is significant (actual failure or likely a failure) or a nuisance event. With defect counts detected by these inspection tools being in the millions, this means the typical SEM review sample sizes required range from a few thousand defects to tens of thousands of defects. This also then places emphasis on the review sampling methods to ensure that weak points or patterns of interest are sampled. Additionally, extreme modulations tend to blow up with high defect counts, which leads to multiple iterations of inspection or the use of novel algorithms to enable inspection of such highly modulated fields.

Therefore, new methods and systems are needed.

BRIEF SUMMARY OF THE DISCLOSURE

A method is disclosed in a first embodiment. The method includes irradiating a reticle or a mask containing a design pattern. Each of the occurrences of irradiation represents a value of a member of a set of lithographic operating variables. The reticle or mask imparts the occurrences of irradiation design pattern information corresponding to each of the values of the member of the set. The lithographic operating variables are focus, energy, and/or overlay. The lithographic operating variables are modulated with respect to each other across a surface of the wafer at two steps of either the focus or the energy below a test condition.

A pattern recording material of a wafer is patterned during the irradiating. The irradiating carries the design pattern information imparted by the reticle or mask.

A spatial pattern corresponding to the design pattern information imparted by the reticle or mask for each of the values of the member of the set is recorded in the pattern recording material. Each spatial pattern being recorded at a different region of the pattern recording material.

A presence of a pattern anomaly associated with the pattern, patterning process, or patterning apparatus is determined from the recorded spatial patterns.

The method can include binning detected defects.

In an instance, a more modulated value of the focus is against a less modulated value of the focus. In another instance, a more modulated value of the energy is against a less modulated value of the energy.

The occurrences of irradiation can be occurrences of light and the pattern recording material is a photoresist material.

The lithographic operating variables at a point on the wafer can both be different from the lithographic operating variables at a neighboring point on the wafer.

A system is disclosed in a second embodiment. The system includes an optical metrology tool. The optical metrology tool includes: a light source (e.g., a broad band plasma source); a detector; a stage configured to hold a wafer with a pattern recording material on a surface of the wafer; and a processor in electronic communication with the detector. The processor is configured to determine from the recorded spatial patterns a presence of a pattern anomaly associated with the pattern, patterning process, or patterning apparatus. The wafer is irradiated with a value of a member of a set of lithographic operating variables. The lithographic operating variables are focus, energy, and/or overlay. The lithographic operating variables are modulated with respect to each other across the surface of the wafer at two steps of either the focus or the energy below a test condition.

A method is provided in a third embodiment. The method includes irradiating a reticle or a mask containing a design pattern. Each of the occurrences of irradiation represents a value of a member of a set of lithographic operating variables. The reticle or mask imparts the occurrences of irradiation design pattern information corresponding to each of the values of the member of the set. The lithographic operating variables are focus, energy, and/or overlay. The lithographic operating variables are modulated such that the lithographic operating variables that are more modulated are arrayed in different directions and that the focus and the dose are modulated in rows.

A pattern recording material of a wafer is patterned during the irradiating. The irradiating carries the design pattern information imparted by the reticle or mask.

A spatial pattern corresponding to the design pattern information imparted by the reticle or mask for each of the values of the member of the set is recorded in the pattern recording material. Each spatial pattern being recorded at a different region of the pattern recording material.

A presence of a pattern anomaly associated with the pattern, patterning process, or patterning apparatus is determined from the recorded spatial patterns.

The method can include binning detected defects.

The occurrences of irradiation can be occurrences of light and the pattern recording material is a photoresist material.

In an instance, a region of the surface of the wafer is patterned with modulations within or extending beyond an expected process window, another region of the surface of the wafer is patterned with a high value of one of the lithographic operating variables, and yet another region of the wafer is patterned with a low value of the one of the lithographic operating variables.

The determining can include comparing a high region to a low region for one of the lithographic operating variables.

A method is provided in a fourth embodiment. The method includes irradiating a reticle or a mask containing a design pattern. Each of the occurrences of irradiation represents a value of a member of a set of lithographic operating variables. The reticle or mask imparts the occurrences of irradiation design pattern information corresponding to each of the values of the member of the set. The lithographic operating variables are focus, energy, and/or overlay. The lithographic operating variables are modulated such that only one of the lithographic operating variables is modulated and that dies are compared at a same modulation condition.

A pattern recording material of a wafer is patterned during the irradiating. The irradiating carries the design pattern information imparted by the reticle or mask.

A spatial pattern corresponding to the design pattern information imparted by the reticle or mask for each of the values of the member of the set is recorded in the pattern recording material. Each spatial pattern being recorded at a different region of the pattern recording material.

A presence of a pattern anomaly associated with the pattern, patterning process, or patterning apparatus is determined from the recorded spatial patterns.

The method can include binning detected defects.

The occurrences of irradiation can be occurrences of light and the pattern recording material is a photoresist material.

In an instance, the one of the lithographic operating variables is modulated in a center of an aggregate process window. In another instance, the one of the lithographic operating variables is modulated on either side of a nominal condition and within a process window.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments of the present disclosure are directed to an image-based approach enhanced with design layout to determine defects in semiconductor devices, which includes the collection of images from modulated patterns (i.e., patterns formed under different conditions). The modulated patterns may be formed deliberately on a modulated wafer used during PWQ. The modulated patterns may be used to identify where within a structure a failure or pattern variation is occurring.

The PWQ procedure performs die-to-die inspection of multiple dies or other repetitive patterns on a semiconductor wafer or other substrate, and the design pattern is lithographic using either a single die reticle, a multi-die reticle, or a mask printed by photoresist patterning performed according to the process. This procedure can select and modulate lighting operating variables. One set of possible illumination operating variables includes illumination focus, illumination exposure, overlay partial illumination coherence, illumination mode, and numerical aperture. Pattern layers recording material such as photoresist covering the test wafer substrate are exposed in the form of grid-like regions arranged in rows and columns. Each identified repeated anomaly is evaluated against a critical status. The procedure of comparing images formed with different values of lithographic operating variables makes it possible to identify single die reticles and detect design pattern defects. If the identified anomaly is in the form of a design pattern, the critical status will depend on the number of occurrences and the location of the anomaly on the design pattern.

Figure 6:
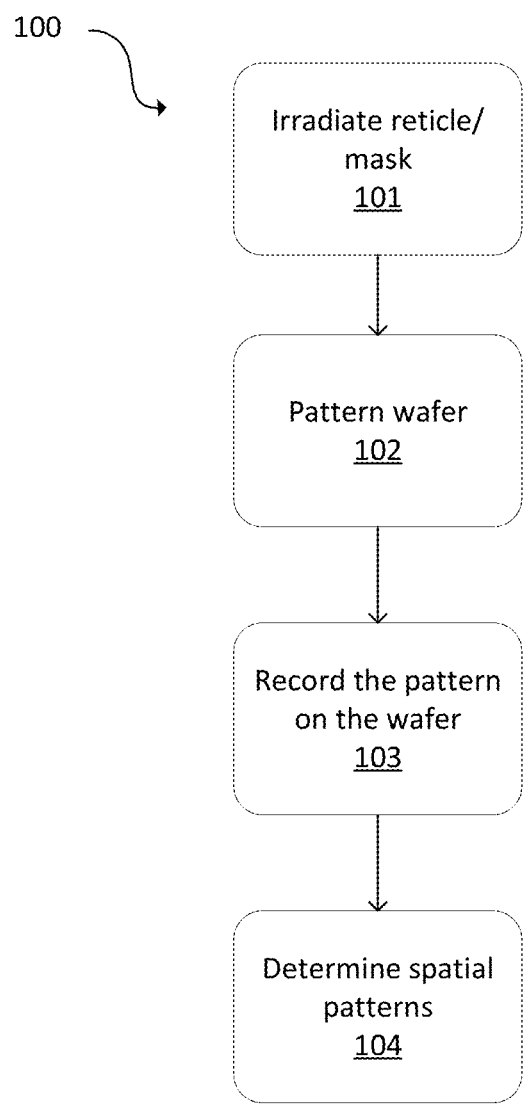
FIG. 6 is a block diagram of an embodiment of a method in accordance with the present disclosure.

FIG. 6 is an embodiment of a method 100. In the method 100, a reticle or a mask containing a design pattern is irradiated at 101. Each of the occurrences of irradiation (e.g., light) represents a value of a member of a set of lithographic operating variables (e.g., focus and energy). The reticle or mask imparts the occurrences of irradiation design pattern information corresponding to each of the values of the member of the set. The pattern recording material of the wafer (e.g., photoresist) is patterned during the irradiating at 102. The irradiating carries the design pattern information imparted by the reticle or mask. In an example with EUV for dose, modulation steps can typically be around 0.5 mJ/cm$^2$ steps and for focus 5-10 nm steps. However, this can be higher for a more robust process step with a wider process window.

A spatial pattern corresponding to the design pattern information imparted by the reticle or mask is recorded in the pattern recording material for each of the values of the member of the set at 103. Each spatial pattern is recorded at a different region of the pattern recording material. This can be used to form the wafer.

A presence of a pattern anomaly associated with the pattern is determined from the recorded spatial patterns, patterning process, or patterning apparatus at 104. Defects can be binned in an embodiment.

Figure 1:
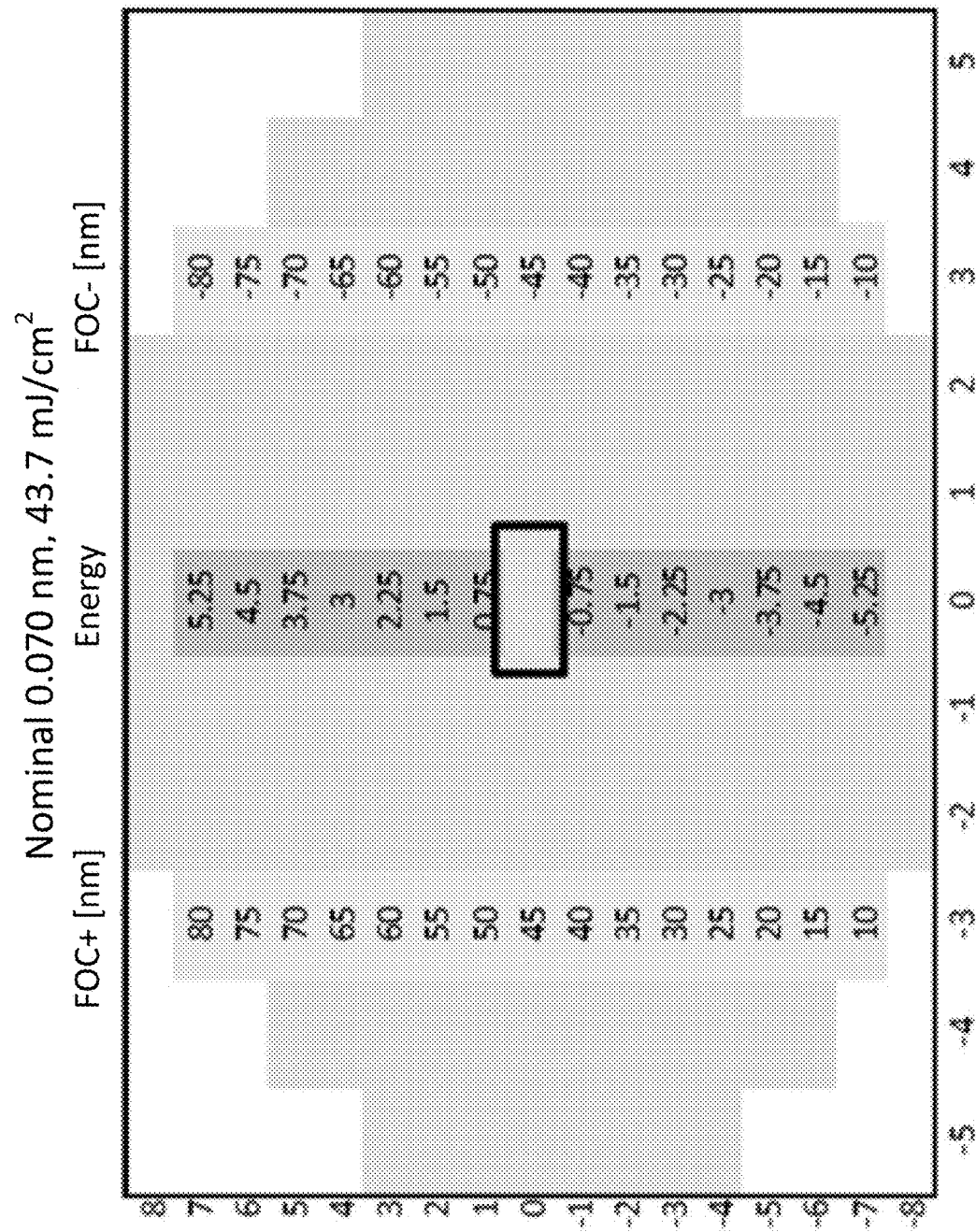
FIG. 1 illustrates an exemplary PWQ wafer layout.
Figure 2:
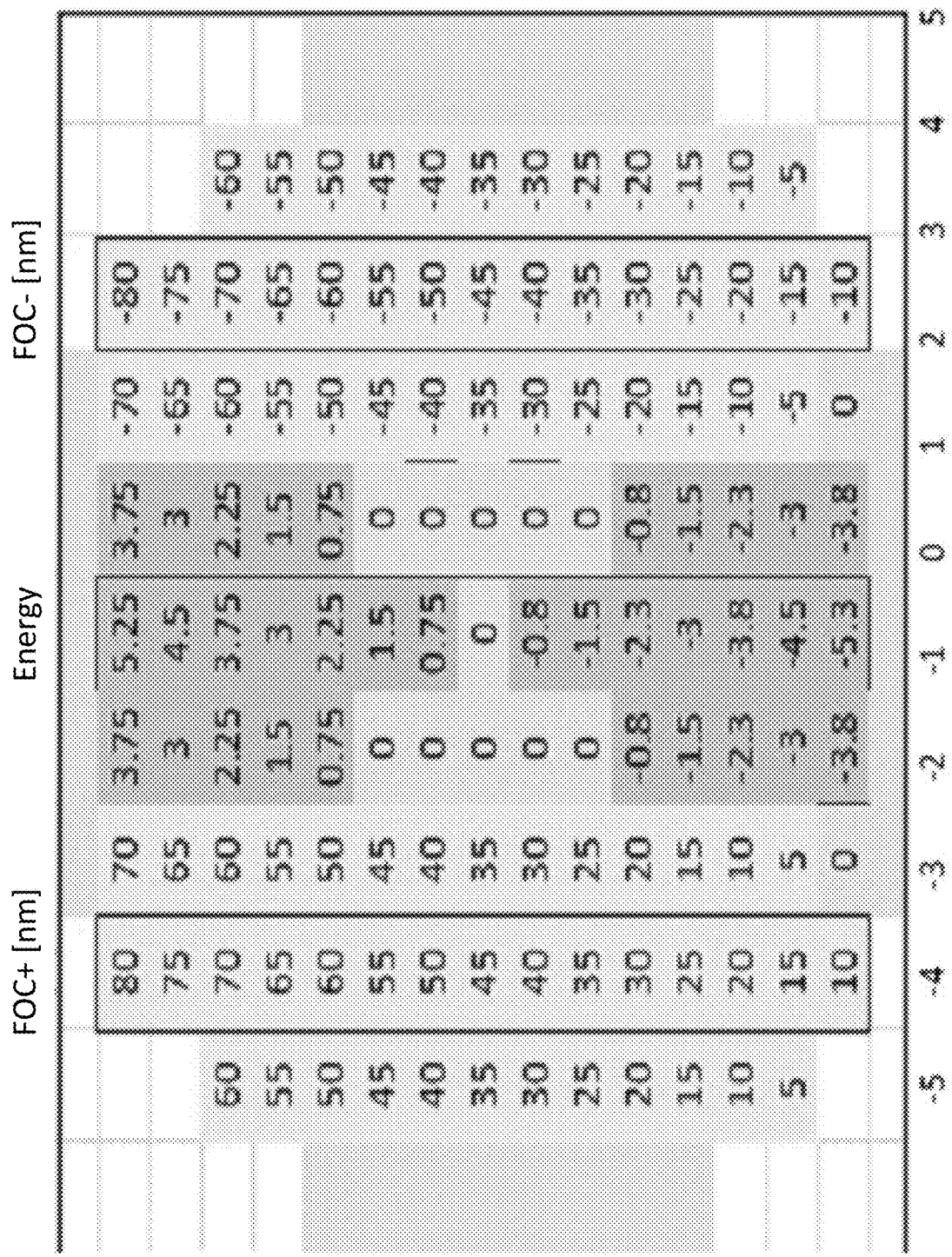
FIG. 2 illustrates a first embodiment of a PWQ wafer layout.

FIG. 2 illustrates a first embodiment of a PWQ wafer layout that can enable improved sensitivity for process window discovery. The PWQ wafer layout in FIG. 2 can be referred to as "hybrid" or "offset." Two modulated conditions are used, which can reduce nuisance. Weak spots can be detected more easily because noise is reduced. In an instance, a second pass can be used to focus on what was identified in a first pass.

In the standard PWQ modulation layout, modulated dies (or fields) are compared to an unmodulated die (or field) to amplify image differences and enable these to be captured as defects. This provides the opportunity to identify failing structures, but CD variation can cause noise due to different process conditions. Rather than discovering failing pattern types where it should be easiest, in highly modulated fields, often these are missed because of the high difference in process conditions. The PWQ wafer layout in FIG. 2 enables comparison to varying offset modulations (between test and reference dies). This still provides the difference between failing and good structures due to changing process conditions, but reduces the impacts of noise induced by the difference in modulations of process conditions such as focus, exposure, and/or overlay. The PWQ wafer layout in FIG. 2 also provides a low risk of diminishing signal from failing patterns. The degree of offset is flexible and can be tuned to process capabilities. For example, there may be a two or three modulations difference between test and reference dies. The modulation offsets can also be dynamic rather than a fixed number as modulation changes from low to high value. Consequently, the layout in FIG. 2 can result in more accurate and often tighter process window identification than more traditional layouts.

The layout in FIG. 2 compares a modulated die or field to slightly lower offset modulated die or field. This enables sensitivity to be maintained, which can capture weak points or patterns of interest with die-to-die inspection or machine learning based approaches while reducing the noise (e.g., from CD variation) between the fields being compared. The number of nuisance events is reduced because noise is reduced. This also enables reduced test scan time and effort, reduced engineering effort for sampling and review budget, and a more accurate process window (i.e. the best sensitivity to the process window) in an empirical study comparing various modulated layouts. Two modulation steps may be used at typical modulation levels. With larger modulation steps, one modulation may be used.

The layout in FIG. 2 compares to a less modulated field for defect detection. Thus, the lithographic operating variables are modulated with respect to each other across a surface of the wafer. For a die-die comparison either for detection of a defect by an optical or electron beam inspector or conformation of a for an electron beam inspector or review tool, the ability to distinguish the difference of "defect" between a reference and test field may be beneficial. The reduction in modulation difference as shown in the example for focus and dose modulations. This offset modulation layout still enables the key differences to be highlighted while reducing noise. In this example, the reference condition is modulated at two steps of either focus or dose below the test condition. The test condition may show the difference between failing and good structures, such as using a transition condition, but can be other values of the operating variables. Other step sizes would be possible based on the robustness of the process. The modulation of the "reference" fields is changed as the modulation for the "test" field is changed. This can be done for focus and exposure separately as shown in FIG. 2 or with a combination of the two modulated together in a more complex modulation layout. Similar overlay can be modulated in the X-direction (e.g., horizontal), Y-direction perpendicular to the X-direction (e.g., vertical), or a combination of both. For example, both dose and focus modulations can applied to the same field such that the dose modulation is 0.75 mJ/cm$^2$ and a focus on −10 nm=0.75, −10.

The lithographic operating variables at a point on the wafer can both be different from the lithographic operating variables at a neighboring point on the wafer. In an instance, a more modulated value of the focus is against a less modulated value of the focus. In another instance, a more modulated value of the energy is against a less modulated value of the energy.

Figure 3:
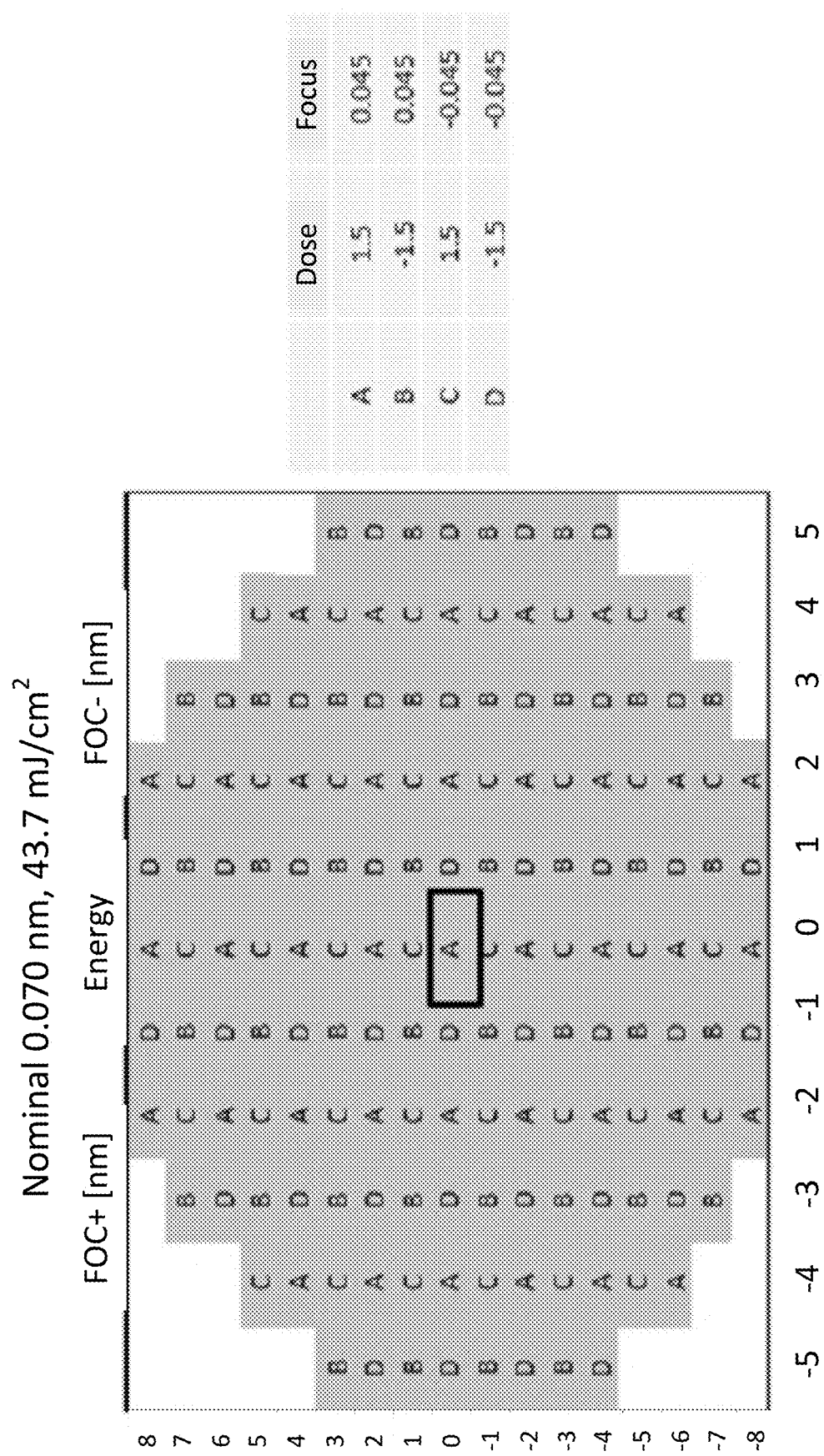
FIG. 3 illustrates a second embodiment of a PWQ wafer layout.

FIG. 3 illustrates a second embodiment of a PWQ wafer layout. The PWQ wafer layout of FIG. 3 can be referred to as a "corner." The layout uses process corners of modulation parameters (e.g., focus and exposure) that are compared against each other. This methodology can provide a validation of a known or expected process window or a reconfirmation of process window over time. The embodiment of FIG. 3 can be used as verification of a process window. The most dissimilar (e.g., most highly modulated in different directions) modulation parameters are compared. This can help monitor a process window between wafers.

In the layout of FIG. 3, corners of an expected or estimated process window are printed. These "corner" conditions are identified as where weak points are expected to begin to appear. This may be achieved through the PWQ process or based on other learning (e.g., electrical failures). The full wafer is then modulated with the transition conditions where we transition from a region of good process window to potential failures of both focus and dose in rows to facilitate a die-die comparison by the inspector. For example, in FIG. 3 the process conditions are identified as this transition of a focus of +1.5 mJ/cm$^2$ to −1.5 mJ/cm$^2$ and a focus change of +0.045 nm to −0.045 nm. Conditions typically may not be symmetrical around 0 because this would depend on the centering of the process window. The high to low corners for a particular condition or combination of conditions are compared. This can provide a higher potential signal or difference between the two conditions to improve detection of a weak point or pattern of interest. This also can provide a way to monitor a process window over time or verify weak points at the boundary of the process window. The layout of FIG. 3 also can provide wafer level signatures of particular weak pattern types enabling potential signal to low frequency patterns of interest. This layout can provide potential signal improvements for the verification of process windows and the ability to detect wafer level signatures.

The lithographic operating variables can be modulated such that the lithographic operating variables that are more modulated are arrayed to enable defect detection. In an instance, a region of the surface of the wafer is patterned with an expected process window, another region of the surface of the wafer is patterned with a high value of one of the lithographic operating variables, and yet another region of the wafer is patterned with a low value of the one of the lithographic operating variables. Determining a pattern anomaly can include comparing a high region to a low region for one of the lithographic operating variables. Selection of a transition region that is too large can lead to a high frequency of failures and can provide limited value. However, modulation conditions with the transition conditions can be valuable to identify other process-related or wafer-related variations that could impact the robustness of the process window such as etch uniformity across wafer or wafer flatness.

Figure 4:
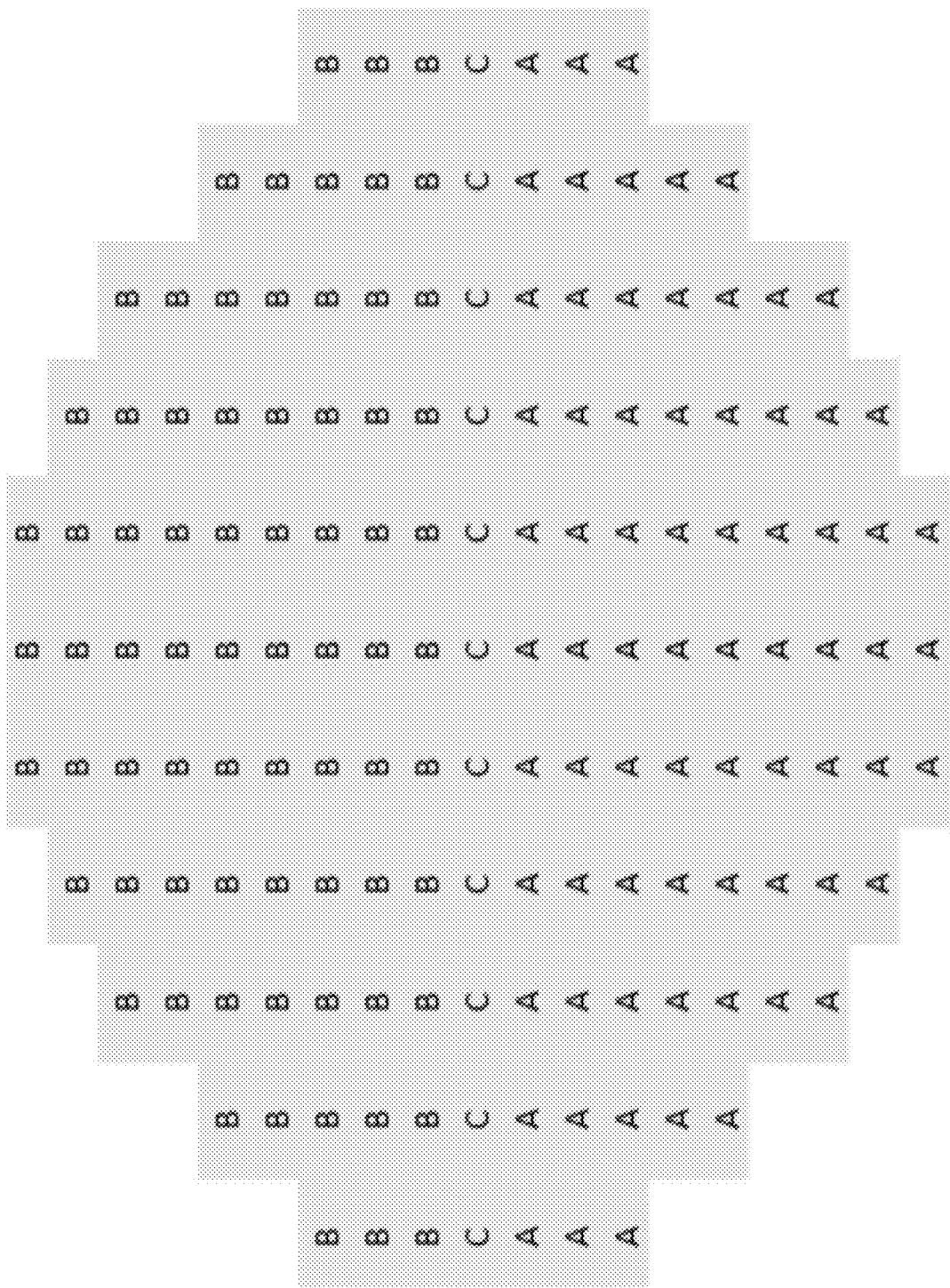
FIG. 4 illustrates a third embodiment of a PWQ wafer layout.
Figure 5:
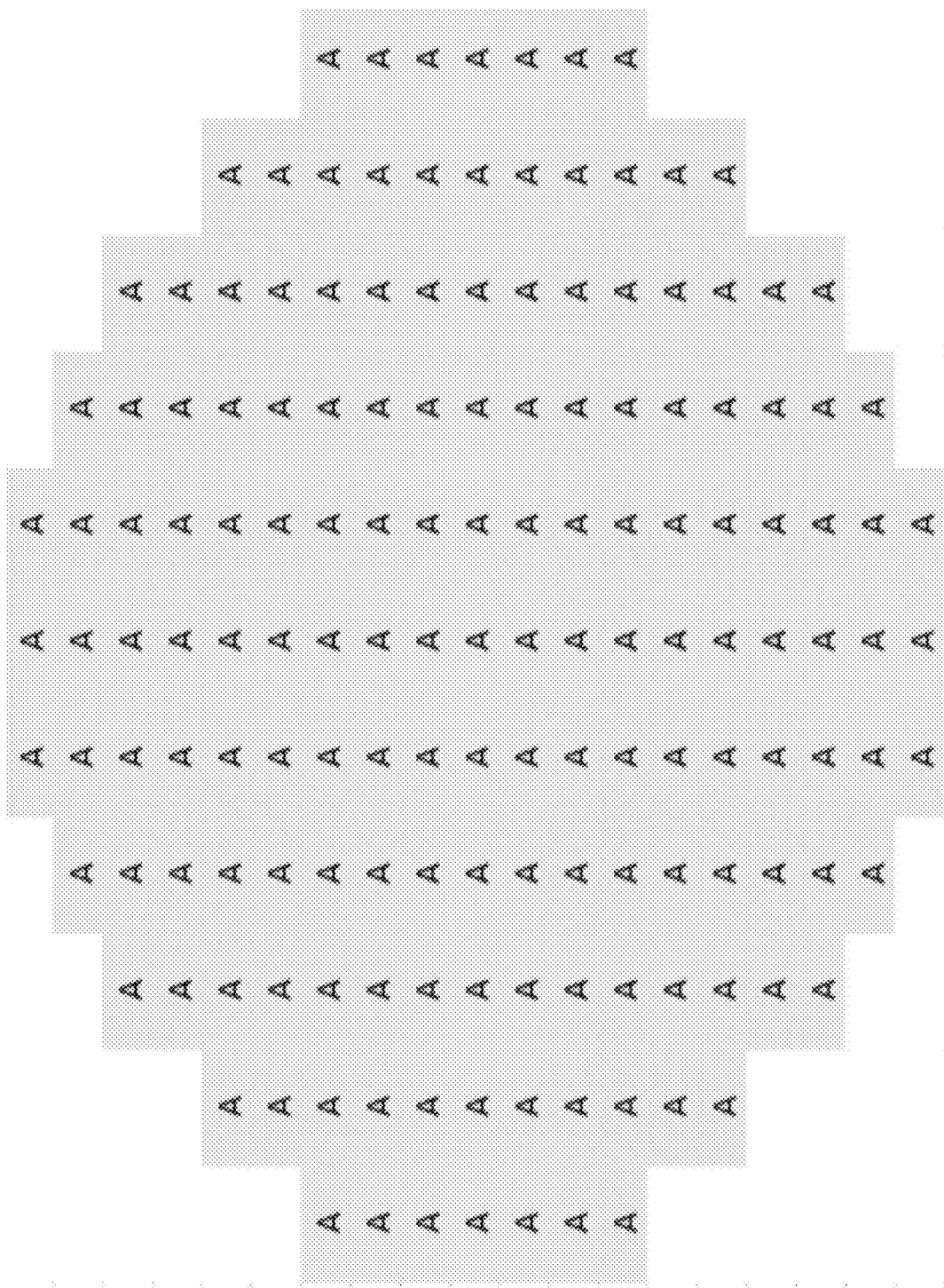
FIG. 5 illustrates another version of the third embodiment of a PWQ wafer layout.

FIGS. 4 and 5 illustrate a third embodiment of a PWQ wafer layout. The PWQ wafer layout of FIGS. 4 and 5 can be referred to as "biased." This embodiment can use process modulation parameters such as focus, exposure, and/or overlay at transition values. Areas of a wafer are modulated to an edge of a process window. This may be achieved through the PWQ process or based on other learnings such as electrical failures. This can be used to estimate criticality (related to failure frequency) of particular weak points of interest. Field (or die) or wafer level signatures can be studied on such a layout. Proactive improvements can be determined.

The layout of FIGS. 4 and 5 can use fixed modulations along the X-axis (e.g., inspection direction). Along the perpendicular Y-axis, the same modulations can be used or different sets of modulations can be used. The modulation level can be in the transition zone. Thus, the modulation level can be based on prior PWQ discovery studies and can be set at low levels to mid-levels. The process parameters can be pushed out of nominal conditions, but the process parameters are configured to avoid introducing massive failures. Pattern failure rates and defect signature can be analyzed, which may lead to insights for further monitoring of weak spots.

The lithographic operating variables can be modulated such that only one or multiple of the lithographic operating variables is modulated. In an instance, the one of the lithographic operating variables is modulated in a center of an aggregate process window. In another instance, the one of the lithographic operating variables is modulated on either side of a nominal condition and within a process window.

In FIGS. 4 and 5, A and B are focus, dose, or overlay modulations. Some combination of conditions is possible. Only one of A and B is modulated. C is a control modulation, which is typically in a center of an aggregate process window (e.g., a nominal condition). A and B can be chosen to be on either side of nominal condition, but within the edge of the process window. The edge can be levels beyond which patterns start to fail consistently showing an increase in defects. Comparing die at the same modulation condition can be used to identify subtle changes in the printing of "weak points" and used to identify changes in process window over time, due to some intervention or change in the condition of a process tool or due to unexpected interactions with deliberate process changes. This can also be used to identify systematic issues affecting the process window not related to the lithography conditions that can be changed (e.g., focus, dose and/or overlay). These can include, but are not limited to, etch uniformity variation across wafer, CMP intra-die or across wafer effects or wafer shape and any changes to wafer shape caused by wafer processing.

PWQ leverages the unique ability of lithography tools to modulate lithography exposure process parameters at the reticle or mask shot level using variables like focus or exposure to determine design-lithography interactions. However, PWQ can be limited to the direct comparison of dies on a wafer that are printed with modulated focus and/or exposure parameters. The impact of other process variables associated with process steps such as etch, deposition, thermal processing, chemical-mechanical polishing (CMP), etc. cannot be directly assessed by PWQ since these variables can only be modulated at the wafer level. These other process variables can be monitored using the embodiments of FIGS. 4 and 5 because these layouts highlight such variations across the wafer that cannot be detected with a single or small number of modulated fields.

In an example, bowing or other wafer conditions can affect measurements. The embodiment of FIGS. 4 and 5 can compensate for center-to-edge variation across a wafer.

The PWQ layouts disclosed herein can be used with the current techniques for process window discovery and hot-spot monitoring and used in existing flows with minimal amounts of customization. Further understanding of weak patterns in design can be provided. This includes stochastic effects in EUV lithography. As an example, sampling plans can be revisited and potentially simplified, tighter process windows can be obtained, and weak hotspots can be monitored or their failure rate can be studied.

The embodiments disclosed herein can enable the detection of weak points or patterns of interest with reduced noise, scan time, and engineering effort. Biased layout helps to understand weak pattern criticality and die (or field) and wafer level signatures. Monitoring of hotspots also can be enabled. The disclosed layouts can be used to replace existing PWQ layouts with the current best-known methods for process window discovery and can be used in existing manufacturing lines with minimal amounts of customization.

Figure 7:
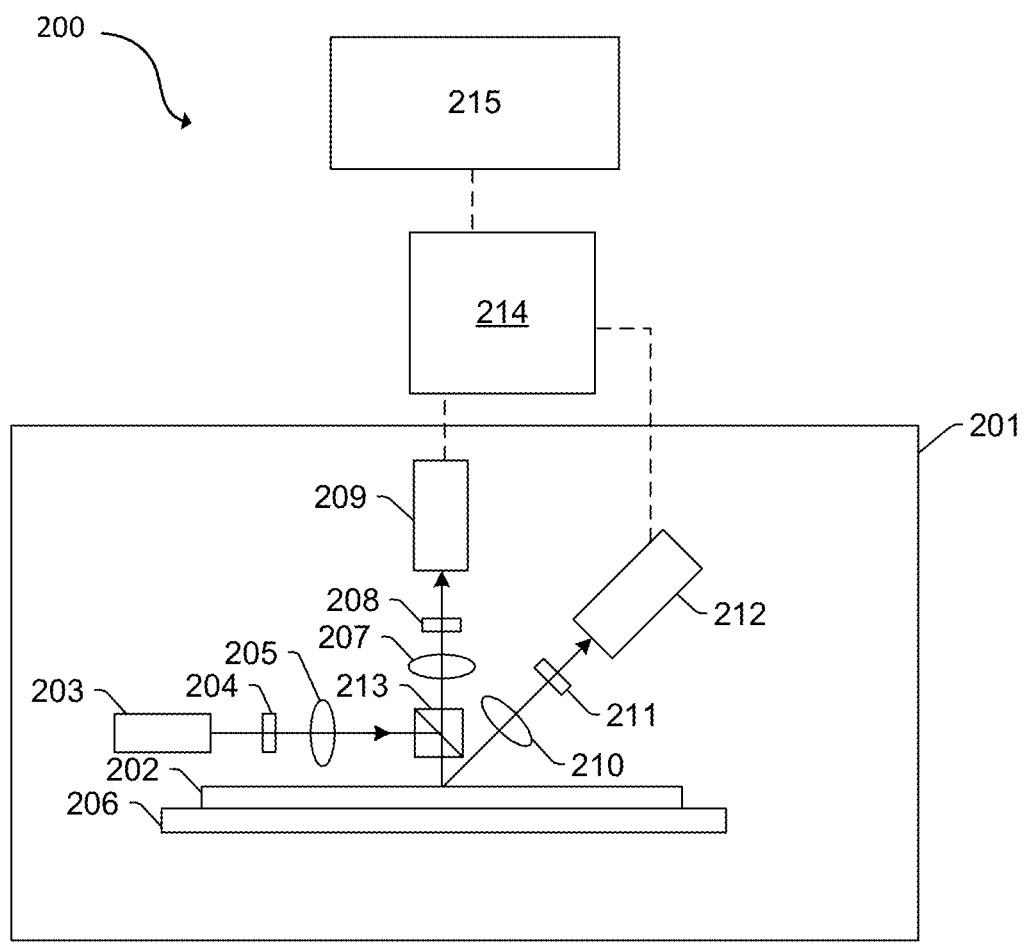
FIG. 7 is a diagram of a system embodiment in accordance with the present disclosure.

One embodiment of a system 200 is shown in FIG. 7. The system 200 includes optical based subsystem 201. In general, the optical based subsystem 201 is configured for generating optical based output for a specimen 202 by directing light to (or scanning light over) and detecting light from the specimen 202. In one embodiment, the specimen 202 includes a wafer. The wafer may include any wafer known in the art. In another embodiment, the specimen 202 includes a reticle. The reticle may include any reticle known in the art.

In the embodiment of the system 200 shown in FIG. 7, optical based subsystem 201 includes an illumination subsystem configured to direct light to specimen 202. The illumination subsystem includes at least one light source. For example, as shown in FIG. 7, the illumination subsystem includes light source 203. In one embodiment, the illumination subsystem is configured to direct the light to the specimen 202 at one or more angles of incidence, which may include one or more oblique angles and/or one or more normal angles. For example, as shown in FIG. 7, light from light source 203 is directed through optical element 204 and then lens 205 to specimen 202 at an oblique angle of incidence. The oblique angle of incidence may include any suitable oblique angle of incidence, which may vary depending on, for instance, characteristics of the specimen 202.

The optical based subsystem 201 may be configured to direct the light to the specimen 202 at different angles of incidence at different times. For example, the optical based subsystem 201 may be configured to alter one or more characteristics of one or more elements of the illumination subsystem such that the light can be directed to the specimen 202 at an angle of incidence that is different than that shown in FIG. 7. In one such example, the optical based subsystem 201 may be configured to move light source 203, optical element 204, and lens 205 such that the light is directed to the specimen 202 at a different oblique angle of incidence or a normal (or near normal) angle of incidence.

In some instances, the optical based subsystem 201 may be configured to direct light to the specimen 202 at more than one angle of incidence at the same time. For example, the illumination subsystem may include more than one illumination channel, one of the illumination channels may include light source 203, optical element 204, and lens 205 as shown in FIG. 7 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 202 at different angles of incidence may be different such that light resulting from illumination of the specimen 202 at the different angles of incidence can be discriminated from each other at the detector(s).

In another instance, the illumination subsystem may include only one light source (e.g., light source 203 shown in FIG. 7) and light from the light source may be separated into different optical paths (e.g., based on wavelength, polarization, etc.) by one or more optical elements (not shown) of the illumination subsystem. Light in each of the different optical paths may then be directed to the specimen 202. Multiple illumination channels may be configured to direct light to the specimen 202 at the same time or at different times (e.g., when different illumination channels are used to sequentially illuminate the specimen). In another instance, the same illumination channel may be configured to direct light to the specimen 202 with different characteristics at different times. For example, in some instances, optical element 204 may be configured as a spectral filter and the properties of the spectral filter can be changed in a variety of different ways (e.g., by swapping out the spectral filter) such that different wavelengths of light can be directed to the specimen 202 at different times. The illumination subsystem may have any other suitable configuration known in the art for directing the light having different or the same characteristics to the specimen 202 at different or the same angles of incidence sequentially or simultaneously.

In one embodiment, light source 203 may include a broad band plasma (BBP) source. In this manner, the light generated by the light source 203 and directed to the specimen 202 may include broad band light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 203 may also include a polychromatic light source that generates light at multiple discrete wavelengths or wavebands.

Light from optical element 204 may be focused onto specimen 202 by lens 205. Although lens 205 is shown in FIG. 7 as a single refractive optical element, it is to be understood that, in practice, lens 205 may include a number of refractive and/or reflective optical elements that in combination focus the light from the optical element to the specimen. The illumination subsystem shown in FIG. 7 and described herein may include any other suitable optical elements (not shown). Examples of such optical elements include, but are not limited to, polarizing component(s), spectral filter(s), spatial filter(s), reflective optical element (s), apodizer(s), beam splitter(s) (such as beam splitter 213), aperture(s), and the like, which may include any such suitable optical elements known in the art. In addition, the optical based subsystem 201 may be configured to alter one or more of the elements of the illumination subsystem based on the type of illumination to be used for generating the optical based output.

The optical based subsystem 201 may also include a scanning subsystem configured to cause the light to be scanned over the specimen 202. For example, the optical based subsystem 201 may include stage 206 on which specimen 202 is disposed during optical based output generation. The scanning subsystem may include any suitable mechanical and/or robotic assembly (that includes stage 206) that can be configured to move the specimen 202 such that the light can be scanned over the specimen 202. In addition, or alternatively, the optical based subsystem 201 may be configured such that one or more optical elements of the optical based subsystem 201 perform some scanning of the light over the specimen 202. The light may be scanned over the specimen 202 in any suitable fashion such as in a serpentine-like path or in a spiral path.

The optical based subsystem 201 further includes one or more detection channels. At least one of the one or more detection channels includes a detector configured to detect light from the specimen 202 due to illumination of the specimen 202 by the subsystem and to generate output responsive to the detected light. For example, the optical based subsystem 201 shown in FIG. 7 includes two detection channels, one formed by collector 207, element 208, and detector 209 and another formed by collector 210, element 211, and detector 212. As shown in FIG. 7, the two detection channels are configured to collect and detect light at different angles of collection. In some instances, both detection channels are configured to detect scattered light, and the detection channels are configured to detect light that is scattered at different angles from the specimen 202. However, one or more of the detection channels may be configured to detect another type of light from the specimen 202 (e.g., reflected light).

As further shown in FIG. 7, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 210, element 211, and detector 212 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 7 shows an embodiment of the optical based subsystem 201 that includes two detection channels, the optical based subsystem 201 may include a different number of detection channels (e.g., only one detection channel or two or more detection channels). In one such instance, the detection channel formed by collector 210, element 211, and detector 212 may form one side channel as described above, and the optical based subsystem 201 may include an additional detection channel (not shown) formed as another side channel that is positioned on the opposite side of the plane of incidence. Therefore, the optical based subsystem 201 may include the detection channel that includes collector 207, element 208, and detector 209 and that is centered in the plane of incidence and configured to collect and detect light at scattering angle(s) that are at or close to normal to the specimen 202 surface. This detection channel may therefore be commonly referred to as a "top" channel, and the optical based subsystem 201 may also include two or more side channels configured as described above. As such, the optical based subsystem 201 may include at least three channels (i.e., one top channel and two side channels), and each of the at least three channels has its own collector, each of which is configured to collect light at different scattering angles than each of the other collectors.

As described further above, each of the detection channels included in the optical based subsystem 201 may be configured to detect scattered light. Therefore, the optical based subsystem 201 shown in FIG. 7 may be configured for dark field (DF) output generation for specimens 202. However, the optical based subsystem 201 may also or alternatively include detection channel(s) that are configured for bright field (BF) output generation for specimens 202. In other words, the optical based subsystem 201 may include at least one detection channel that is configured to detect light specularly reflected from the specimen 202. Therefore, the optical based subsystems 201 described herein may be configured for only DF, only BF, or both DF and BF imaging. Although each of the collectors are shown in FIG. 7 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 214 may be configured to generate images of the specimen 202 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 7 is provided herein to generally illustrate a configuration of an optical based subsystem 201 that may be included in the system embodiments described herein or that may generate optical based output that is used by the system embodiments described herein. The optical based subsystem 201 configuration described herein may be altered to optimize the performance of the optical based subsystem 201 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 214 may be coupled to the components of the system 200 in any suitable manner (e.g., via one or more transmission media, which may include wired and/or wireless transmission media) such that the processor 214 can receive output. The processor 214 may be configured to perform a number of functions using the output. The system 200 can receive instructions or other information from the processor 214. The processor 214 and/or the electronic data storage unit 215 optionally may be in electronic communication with a wafer inspection tool, a wafer metrology tool, or a wafer review tool (not illustrated) to receive additional information or send instructions. For example, the processor 214 and/or the electronic data storage unit 215 can be in electronic communication with a scanning electron microscope.

The processor 214, other system(s), or other subsystem(s) described herein may be part of various systems, including a personal computer system, image computer, mainframe computer system, workstation, network appliance, interne appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 214 and electronic data storage unit 215 may be disposed in or otherwise part of the system 200 or another device. In an example, the processor 214 and electronic data storage unit 215 may be part of a standalone control unit or in a centralized quality control unit. Multiple processors 214 or electronic data storage units 215 may be used.

The processor 214 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 214 to implement various methods and functions may be stored in readable storage media, such as a memory in the electronic data storage unit 215 or other memory.

If the system 200 includes more than one processor 214, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 214 may be configured to perform a number of functions using the output of the system 200 or other output. For instance, the processor 214 may be configured to send the output to an electronic data storage unit 215 or another storage medium. The processor 214 may be configured according to any of the embodiments described herein. The processor 214 also may be configured to perform other functions or additional steps using the output of the system 200 or using images or data from other sources.

In an instance, the processor 214 is in communication with the system 200. The processor 214 is configured to determine from the recorded spatial patterns a presence of a pattern anomaly associated with the pattern, patterning process, or patterning apparatus. In an instance, the specimen 202 was irradiated with a value of a member of a set of lithographic operating variables (e.g., focus and energy). The specimen 202 can include any of the PWQ layouts disclosed herein. The processor 214 can be configured to make determinations of pattern anomalies of any of the PWQ layouts disclosed herein.

An additional embodiment relates to a non-transitory computer-readable medium storing program instructions executable on a controller for performing a computer-implemented method for determining from the recorded spatial patterns a presence of a pattern anomaly associated with the pattern, patterning process, or patterning apparatus, as disclosed herein. In particular, as shown in FIG. 7, electronic data storage unit 215 or other storage medium may contain non-transitory computer-readable medium that includes program instructions executable on the processor 214. The computer-implemented method may include any step(s) of any method(s) described herein, including method 100.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

Another embodiment relates to the wafer, mask, reticle, or other specimen that is used to determine from the recorded spatial patterns a presence of a pattern anomaly associated with the pattern, patterning process, or patterning apparatus, as disclosed herein. The specimen can be used with any step(s) of any method(s) described herein, including method 100. The specimen can include the patterns shown in FIGS. 2-5.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
   irradiating a reticle or a mask containing a design pattern, each occurrence of irradiation representing a value of a member of a set of lithographic operating variables, wherein the reticle or mask imparts the occurrences of irradiation design pattern information corresponding to each of the values of the member of the set, wherein the lithographic operating variables are focus, dose, and/or overlay, wherein the lithographic operating variables are modulated such that only one of the lithographic operating variables is modulated and that dies are compared at a same modulation condition, wherein a control modulation with a nominal condition is included at a center of the design pattern, wherein the control modulation is used in an entirety of at least one row of the dies in a first direction, wherein the one of the lithographic operating variables is modulated on either side of the row with the nominal condition and within a process window, and wherein the lithographic operating variables modulated on either side of the nominal condition are disposed on opposite sides of the control modulation in a second direction of the design pattern perpendicular to the first direction such that a different one of the lithographic operating variables is used on the opposite sides of the control modulation whereby the one of the lithographic operating variables that is modulated is only on one of the opposite sides of the control modulation;
   patterning a patterning recording material of a wafer during the irradiating, wherein the irradiating carries the design pattern information imparted by the reticle or mask;
   recording in the pattern recording material a spatial pattern corresponding to the design pattern information imparted by the reticle or mask for each of the values of the member of the set, each spatial pattern being recorded at a different region of the pattern recording material;
   determining from the recorded spatial patterns a presence of a pattern anomaly associated with the pattern, patterning process, or patterning apparatus; and
   determining from the recorded spatial patterns a change in the process window over time due to a condition of a process tool that fabricated the wafer.

2. The method of claim 1, further comprising binning detected defects.

3. The method of claim 1, wherein the occurrences of irradiation are occurrences of light and the pattern recording material is a photoresist material.

4. The method of claim 1, wherein the one of the lithographic operating variables is modulated in a center of an aggregate process window.

* * * * *